(12) United States Patent
Matsui et al.

(10) Patent No.: US 10,756,239 B2
(45) Date of Patent: Aug. 25, 2020

(54) SYNTHETIC QUARTZ GLASS LID AND OPTICAL DEVICE PACKAGE

(71) Applicant: Shin-Etsu Chemical Co., Ltd., Tokyo (JP)

(72) Inventors: Harunobu Matsui, Joetsu (JP); Daijitsu Harada, Joetsu (JP); Masaki Takeuchi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/666,896

(22) Filed: Aug. 2, 2017

(65) Prior Publication Data

US 2018/0040777 A1 Feb. 8, 2018

(30) Foreign Application Priority Data

Aug. 3, 2016 (JP) .................................. 2016-152495

(51) Int. Cl.
| | |
|---|---|
| *H01L 33/48* | (2010.01) |
| *C03C 27/00* | (2006.01) |
| *C03C 27/08* | (2006.01) |
| *C22C 45/00* | (2006.01) |

(52) U.S. Cl.
CPC ............ *H01L 33/483* (2013.01); *C03C 27/00* (2013.01); *C03C 27/08* (2013.01); *C22C 45/003* (2013.01)

(58) Field of Classification Search
CPC ...... H01L 33/483; C03C 27/08; C22C 45/003
See application file for complete search history.

(56) References Cited

U.S. PATENT DOCUMENTS

| | | | | |
|---|---|---|---|---|
| 3,369,159 | A | * | 2/1968 | Parker ................ H01L 21/8234 257/288 |
| 7,837,009 | B2 | * | 11/2010 | Gross ...................... B32B 27/12 181/208 |
| 8,013,350 | B2 | | 9/2011 | Itoi et al. |
| 2004/0129978 | A1 | * | 7/2004 | Hirai ..................... H01L 27/283 257/347 |
| 2007/0207284 | A1 | * | 9/2007 | McClintic ................ B32B 7/12 428/40.1 |
| 2011/0114954 | A1 | * | 5/2011 | Lee ...................... H01L 51/5246 257/59 |
| 2014/0261975 | A1 | | 9/2014 | Sridharan et al. |
| 2015/0279700 | A1 | * | 10/2015 | Kodama .................... C03C 8/02 428/212 |

(Continued)

FOREIGN PATENT DOCUMENTS

| | | |
|---|---|---|
| JP | 2008-219854 A | 9/2008 |
| JP | 2015-505792 A | 2/2015 |
| JP | 2015-149533 A | 8/2015 |

*Primary Examiner* — Fernando L Toledo
*Assistant Examiner* — Neil R Prasad
(74) *Attorney, Agent, or Firm* — Birch, Stewart, Kolasch & Birch, LLP

(57) ABSTRACT

A synthetic quartz glass lid is provided comprising a synthetic quartz glass and an adhesive formed on a periphery of a main surface of the window member. Further, an optical device package is provided comprising a box-shaped receptacle having an open upper end, an optical device received in the receptacle, and a window member of synthetic quartz glass bonded to the upper end of the receptacle with an adhesive. The adhesive is a low-melting metallic glass consisting of Te, Ag and at least one element selected from W, V, P, Ba, and Zr.

8 Claims, 2 Drawing Sheets

(56) References Cited

U.S. PATENT DOCUMENTS

2016/0005890 A1* 1/2016 Kim .................. H01B 1/16
136/256
2019/0019911 A1* 1/2019 Hardin ............... H01L 31/0512

* cited by examiner

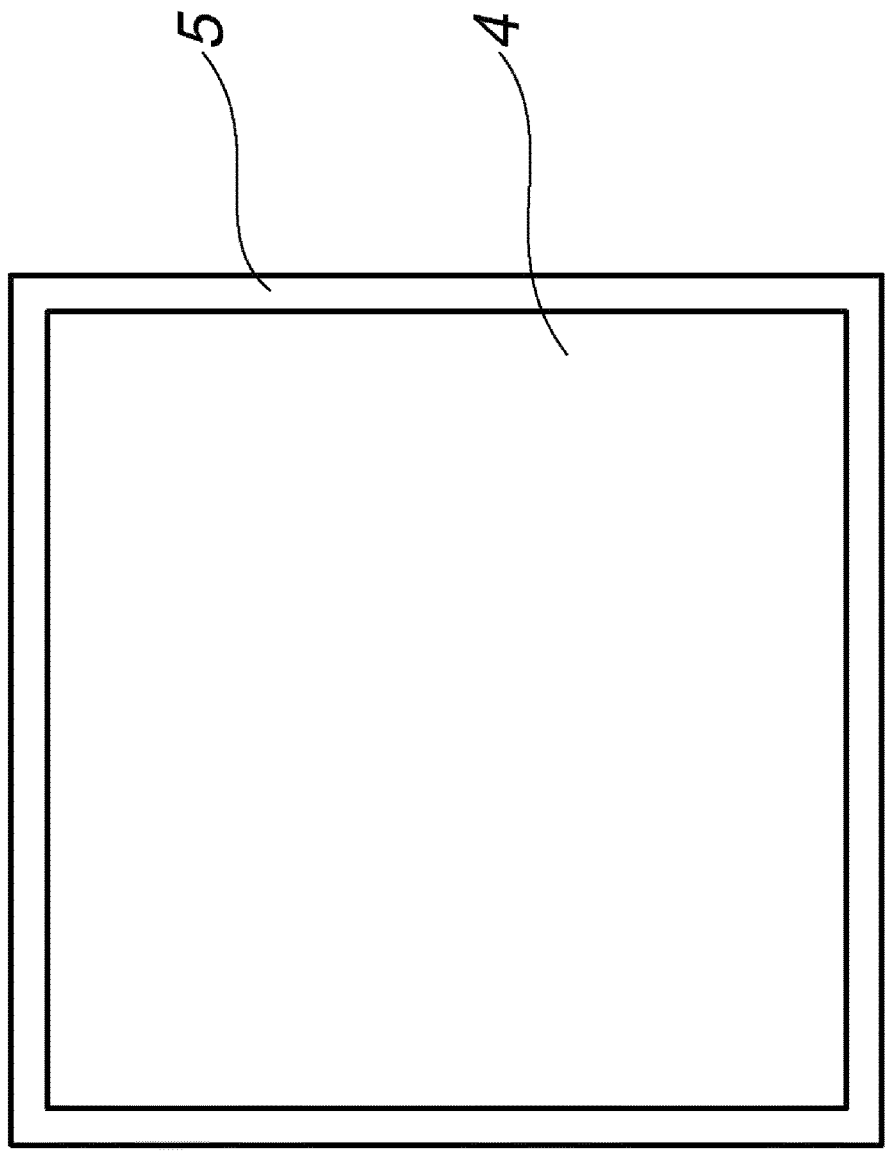

SYNTHETIC QUARTZ GLASS LID AND OPTICAL DEVICE PACKAGE

CROSS-REFERENCE TO RELATED APPLICATION

This non-provisional application claims priority under 35 U.S.C. § 119(a) on Patent Application No. 2016-152495 filed in Japan on Aug. 3, 2016, the entire contents of which are hereby incorporated by reference.

TECHNICAL FIELD

This invention relates to a synthetic quartz glass lid, using synthetic quartz glass in sealing of UV-LEDs, laser light sources having an increased output of short wavelength light or the like, especially UV band light sources, and an optical device package using the same.

BACKGROUND ART

As the use of mercury lamps is regulated, UV-LEDs capable of emitting short wavelength light, especially UV band light is regarded promising as the replacement. While LEDs can produce light of arbitrary wavelength, LEDs of wavelength for a particular application are developed. For example, wavelength 265 nm in the UV region is known effective for sterilization. UV-LEDs adapted to emit light of wavelength 265 nm are developed for the sterilization application. Even when optical devices of 265 nm are in constant supply, it is difficult to use the optical devices without packages. It is thus required to package the UV-LED while maximizing the light extraction efficiency from the UV-LED.

When optical devices capable of emitting light of long wavelength such as IR region including LEDs are packaged, an adhesive is necessary for bonding a window member to a receptacle having the optical device mounted in place. There are known a variety of adhesives including organic adhesives such as epoxy resin and acrylic resin base adhesives and glass frits.

For example, Patent Document 1 proposes sealing of inorganic substrates of strengthened glass having a melting point of about 300° C. using a paste obtained by mixing a glass frit with a microwave coupling agent as an adhesive, for purposes such as solar cell encapsulation and OLED packaging. This method is successful in bonding substrates by applying microwave to the adhesive area, without losing the strength of strengthened glass used as window member.

Patent Document 2 discloses to use a UV-curable acrylic liquid resin or thermosetting resin as the adhesive in bonding micro lenses.

Patent Document 3 describes packaging of electronic devices using a vanadium-based low-melting glass having a coefficient of linear thermal expansion close to the coefficients of linear thermal expansion of base substrate and lid as the adhesive. This method achieves fully hermetic packaging.

CITATION LIST

Patent Document 1: JP-A 2015-505792 (US 20140261975)
Patent Document 2: JP-A 2008-219854 (U.S. Pat. No. 8,013,350)
Patent Document 3: JP-A 2015-149533

SUMMARY OF INVENTION

In Patent Document 1, however, the applicable temperature is restricted to 300° C. from the standpoint of strength of tempered glass. It is thus difficult to use the adhesive on a heat-generating light source of short wavelength over a long service time. Further, since the glass frit is not composed of pure $SiO_2$ glass component alone, damages by the energy that light of short wavelength possesses act to reduce UV resistance. Thus the adhesive is least viable in the short wavelength region.

Patent Document 2 uses a UV-curable adhesive. Even the adhesive of UV-curable type becomes brittle during continued exposure to UV which causes excessive internal crosslinks to the resin in the adhesive.

In Patent Document 3, substrates of dense crystalline structure having different coefficients of thermal expansion are bonded together. Then, more or less stresses are induced. During long-term service, the seal can be disintegrated due to defects and metal grain boundaries within the metal crystalline structure.

An object of the invention is to provide a synthetic quartz glass lid and a package for an optical device of short wavelength, especially wavelength region of up to 280 nm, the package being stable over a long term and overcoming the stress problem associated with bonding of heterogeneous materials.

The inventors have found that an alloy of disordered crystalline structure containing tellurium and silver as essential metal elements and composed of at least three metal elements including the two metal elements is useful as the adhesive to be applied to synthetic quartz glass. On use of this low-melting metallic glass, a package capable of sealing the optical device over a long term in a stable manner is available because the disordered crystalline structure absorbs any stress induced in bonding of substrates having different coefficients of thermal expansion.

When synthetic quartz glass is used as the window member by which light of short wavelength of up to 300 nm, especially wavelength of up to 280 nm, is transmitted in a stable manner, efficient extraction of UV light is possible. Since a low-melting metallic glass which is a UV resistant material and which has a crystalline structure capable of absorbing the stress induced from synthetic quartz glass having a different coefficient of thermal expansion is used as the adhesive, especially, a synthetic quartz glass lid utilizing the low-melting metallic glass as the adhesive is used, there is obtained a package which is stable over a long term relative to an optical device of short wavelength. Since the adhesive contains tellurium capable of taking any oxidation number and having a large atomic size and silver having good ductility, long-term service is possible.

The invention provides a synthetic quartz glass lid comprising a window member of synthetic quartz glass, and an adhesive formed on a periphery of a main surface of the window member. The adhesive is a low-melting metallic glass consisting essentially of tellurium, silver and at least one element selected from the group consisting of tungsten, vanadium, phosphorus, barium, and zirconium.

Preferably, the low-melting metallic glass contains 50 to 70% by weight of tellurium and silver combined. Also preferably the low-melting metallic glass has a glass transition temperature of 100 to 450° C.

In a preferred embodiment, the window member is of plate shape, spherical shape having a convex or concave contour, or non-spherical shape having a convex or concave contour. The window member has a thickness of 0.1 to 5 mm.

The invention further provides an optical device package comprising an optical device, a box-shaped receptacle having an open upper end, the optical device being received in the receptacle, and the synthetic quartz glass lid. The window member of synthetic quartz glass is bonded to the upper end of the receptacle with the adhesive to cover the receptacle.

Preferably, the optical device emits light of wavelength up to 300 nm.

Advantageous Effects of Invention

The invention solves the problem of prior art organic adhesives including fissure and stripping caused by light of short wavelength and the problem of stress in bonding of heterogeneous materials which is the drawback of gold-tin or similar metal-based adhesives having a dense metal crystalline structure. The optical device package using the synthetic quartz glass lid will be an effective package in the future when an optical device replacing the mercury lamp is developed.

BRIEF DESCRIPTION OF DRAWINGS

FIG. 2 is a plan view of one exemplary synthetic quartz glass lid.

DESCRIPTION OF PREFERRED EMBODIMENTS

Figure 1:
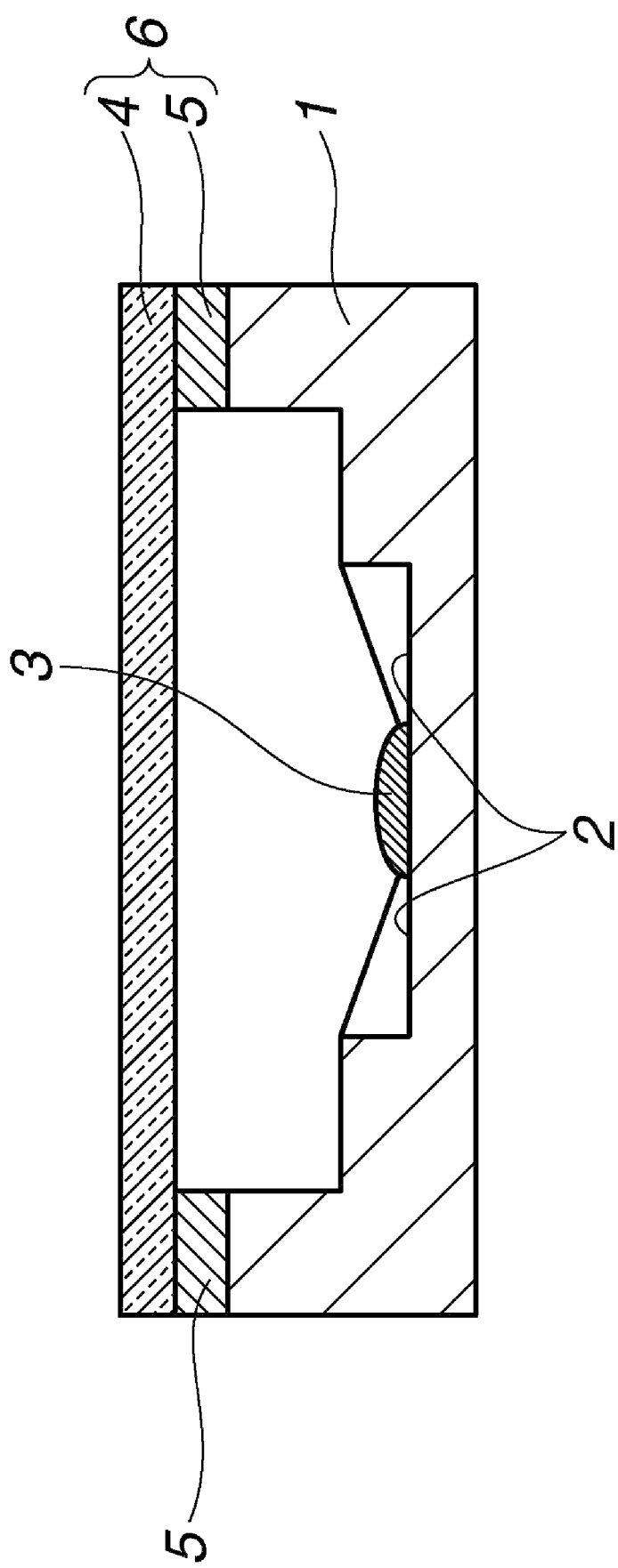
FIG. 1 is a cross-sectional view of one exemplary optical device package according to the invention.

One embodiment of the invention is an optical device package comprising a receptacle 1 of rectangular box shape having a side wall and a bottom defining a cavity therein. The bottom is provided at the center with a recess 2 where an optical device 3 is disposed at the center. The side wall has an open upper end.

If the heat generated by the optical device persists within the package so that the package is at high temperature as often found with LEDs, the performance or emission efficiency of the optical device is degraded. Accordingly, the receptacle for optical device packages intended for high power application is preferably made of alumina based ceramics, alumina nitride based ceramics, and the foregoing ceramics plated with a metal such as gold or copper.

In the optical device package of the invention, a synthetic quartz glass lid 6 including a window member 4 of synthetic quartz glass and an adhesive 5 formed on the periphery of the main surface of the window member 4 is disposed on the receptacle 1 to cover the upper opening and to close the receptacle cavity. Specifically, the window member 4 is bonded to the upper end (or rim) of the receptacle 1 with an adhesive 5.

The window member of synthetic quartz glass may be of plate shape, spherical shape having a convex or concave contour, or non-spherical shape having a convex or concave contour. For the mere purpose of sealing the receptacle having the optical device received therein, a plate shape member is preferred from the standpoints of cost and ease of handling. Where efficient extraction of light from the optical device is additionally desired, window members are preferably of spherical shape or non-spherical shape such as plano-convex lens, plano-concave lens, and convex meniscus lens having a convex and/or concave contour designed based on optical computation. The thickness of the window member may be determined as appropriate depending on a pressure difference from the pressure (atmospheric or hydraulic pressure) on the outside of the window member, i.e., the outside of the package. From the standpoint of strength, the thickness of the window member is preferably at least 0.1 mm, more preferably at least 0.2 mm and up to 5 mm, more preferably up to 4 mm.

The adhesive used herein is a low-melting metallic glass. As shown in FIG. 2, the adhesive 5 is preferably applied to the periphery of the window member 4 to a width of 300 to 500 µm and a height (thickness) of 30 to 100 µm. The adhesive of this design absorbs any stresses induced in bonding of heterogeneous materials, window member (synthetic quartz glass) and receptacle and minimizes any damage to the structure by light of short wavelength, ensuring that the optical device package is stable over a long term. The low-melting metallic glass used as the adhesive contains at least tellurium and silver and further contains at least one element selected from the group consisting of tungsten, vanadium, phosphorus, barium, and zirconium.

Synthetic quartz glass is an amorphous composed of $SiO_2$. On application of the adhesive to a window member of synthetic quartz glass, if a single metal atom or an alloy consisting of two types of metal atoms, having an ordered crystalline structure, is selected as the adhesive, its adhesion at the interface with the synthetic quartz glass is poor. This indicates low water resistance and low stability against external impacts on use of the package, leading to failure of the package.

The low-melting metallic glass used herein is a metal alloy in which metal atoms of three or more types gather in disorder and consolidate together and no crystalline structure is formed despite metal basis. Then the nano-level disordered atomic arrangement that the metallic glass possesses closely bonds to the surface of synthetic quartz glass in a flexible manner. Thus a strong bond is established between the synthetic quartz glass and the adhesive, affording water resistance and resistance against external impacts.

When the adhesive is considered from the standpoint of adhesion, metal elements capable of forming virtual covalent bonds between $SiO_2$ of synthetic quartz glass and the adhesive are preferred. Also from consideration of the flexibility attributable to the nano-level disordered atomic arrangement in the crystalline structure of the low-melting metallic glass, the metallic glass is preferably composed of metal atoms having different atomic radii. On use of the low-melting metallic glass having a crystalline structure of nano-level disordered atomic arrangement, atoms are mobile, though slightly, within the crystalline structure so that any stresses induced in bonding of synthetic quartz glass and receptacle may be absorbed by the adhesive layer. In further consideration of the availability of metal elements capable of meeting these two requirements, one of the essential elements to constitute the metallic glass is tellurium capable of taking a stable oxidation number of +4 and having a large atomic size.

In bonding the window member of synthetic quartz glass and the receptacle via the adhesive, an adhesive layer of dense structure is formed when the adhesive is ductile. If silver is mixed in the metallic glass, the low-melting metallic glass as the adhesive can form an arbitrary bond width under bonding conditions such as load and heat, owing to the substantial ductility of silver. By controlling the bond width, the size of an effective area (or window) of the window member may be freely changed, and the output of emergent light be controlled.

In overall consideration of tight or close adhesion to synthetic quartz glass, absorption and relaxation of stresses induced in bonding of heterogeneous materials, synthetic quartz glass and receptacle, and ductility of the adhesive, the metallic glass preferably has a total content of tellurium and silver of 50 to 70% by weight, more preferably 55 to 70% by weight, and most preferably 55 to 65% by weight. In further consideration of flexibility of the metallic glass, in the total of these two elements, tellurium and silver are preferably in a weight ratio of from 1:1 to 3:1.

To provide the low-melting metallic glass with flexibility within its crystalline structure, an element having a substantially different atomic size from tellurium and silver is preferably mixed in the metallic glass. In view of thermal properties and radiation, at least one element selected from the group consisting of tungsten, vanadium, phosphorus, barium, and zirconium is preferred. The content of third element is the balance to the tellurium and silver content. Among these, zirconium is more preferred. Preferably zirconium is added in a content of 10 to 30% by weight based on the metallic glass. The content of tungsten is preferably 0 to 15%, more preferably 5 to 10%, the content of vanadium is preferably 0 to 30%, more preferably 5 to 20%, the content of phosphorus is preferably 0 to 15%, more preferably 1 to 10%, and the content of barium is preferably 0 to 15%, more preferably 1 to 10%, all by weight.

The low-melting metallic glass used as adhesive has a glass transition temperature (Tg), that is, a temperature at which the glass becomes effective adhesive. As viewed from the fluidity of the metallic glass and heat resistance of the optical device, the Tg is preferably in a range of 100 to 450° C., more preferably 150 to 400° C., and even more preferably 200 to 400° C.

The low-melting metallic glass as adhesive may be applied to a window member of synthetic quartz glass by any desired technique such as screen printing, dispensing or stamping. To a quartz glass member of plate shape, the metallic glass may be applied by screen printing at a high accuracy and in a mass scale. To a quartz glass member of spherical or non-spherical shape having a convex and/or concave contour, the metallic glass may be applied by stamping.

The optical device used herein is a device capable of emitting light of wavelength up to 300 nm. Examples of the device capable of emitting light of wavelength up to 300 nm include UV-LEDs, ArF excimer laser, KrF excimer laser, and YAG FHG laser.

The package is generally prepared by preparing a synthetic quartz glass lid whose adhesive is applied to the window member of synthetic quartz glass along its periphery of the main surface, and bonding the window member to the receptacle having the optical device received therein. Alternatively, the package may be prepared by preparing an adhesive of low-melting metallic glass, applying the adhesive to the upper end of the receptacle having the optical device received therein, and bonding the window member of synthetic quartz glass to the receptacle.

EXAMPLE

Examples of the invention are given below by way of illustration and not by way of limitation.

Example 1

A synthetic quartz glass wafer substrate (diameter 6 inches, thickness 0.2 mm) as sliced was lapped on a double-sided lapping machine of planetary motion and roughly polished on a double-sided polishing machine of planetary motion, obtaining a starting substrate. The wafer substrate as polished was cut into dies of 3.5 mm squares by means of a dicing saw. A low-melting metallic glass (Tg=300° C.) in the form of an alloy consisting of 45 wt % tellurium, 25 wt % silver and 30 wt % zirconium was applied to the wafer substrate (window member) by screen printing. Specifically the metallic glass was applied so as to define an adhesive layer having a line width of 400 μm and a thickness of 50 to 70 μm, obtaining a synthetic quartz glass lid whose window member coated with the metallic glass in semi-cured state. An LED chip capable of emitting light of wavelength 265 nm was mounted in a receptacle of alumina-based ceramic material. The synthetic quartz glass lid was pressed to the receptacle at 390° C. under a load of 2 kg/cm$^2$ for 60 minutes, to bond the receptacle and the window member, completing an optical device package.

The optical device package was operated to emit light of wavelength 265 nm for at least 3,000 hours. There was observed neither separation of the adhesive layer caused by any stress induced between the alumina-based ceramic and the synthetic quartz glass nor damage to the metallic glass by light of short wavelength 265 nm. The package fully functioned as a package for an optical device for short-wavelength application.

Example 2

A synthetic quartz glass wafer substrate (diameter 6 inches, thickness 0.3 mm) as sliced was lapped on a double-sided lapping machine of planetary motion and roughly polished on a double-sided polishing machine of planetary motion, obtaining a starting substrate. The wafer substrate as polished was cut into dies of 4.0 mm squares by means of a dicing saw. A low-melting metallic glass (Tg=350° C.) in the form of an alloy consisting of 36 wt % tellurium, 26 wt % silver, 3 wt % phosphorus, 10 wt % barium, 10 wt % tungsten, and 15 wt % zirconium was applied to the wafer substrate (window member) by screen printing. Specifically the metallic glass was applied so as to define an adhesive layer having a line width of 300 μm and a thickness of 30 to 50 μm, obtaining a synthetic quartz glass lid whose window member coated with the metallic glass in semi-cured state. To a receptacle of alumina nitride-based ceramic material having an LED chip capable of emitting light of wavelength 280 nm mounted therein, the synthetic quartz glass lid was pressed at 330° C. under a load of 1 kg/cm$^2$ for 25 minutes, to bond the receptacle and the window member, completing an optical device package.

The optical device package was operated to emit light of wavelength 280 nm for at least 3,000 hours. There was observed neither separation of the adhesive layer caused by any stress induced between the alumina nitride-based ceramic and the synthetic quartz glass nor damage to the metallic glass by light of short wavelength 280 nm. The package fully functioned as a package for an optical device for short-wavelength application.

Comparative Example 1

Onto a synthetic quartz glass substrate (window member) cut to 3.5 mm squares as in Example 1, an UV-curable acrylic resin-based adhesive UVX-8400 (Denki Kagaku Kogyo K. K.) was applied by means of a dispenser as in Example 1, obtaining a synthetic quartz glass lid whose window member coated with the adhesive in semi-cured state. To a receptacle of alumina-based ceramic material having an LED chip capable of emitting light of wavelength 265 nm mounted therein, the synthetic quartz glass lid was pressed at 150° C. under a load of 1 kg/cm² for 30 minutes, to bond the receptacle and the window member, completing an optical device package.

The optical device package was operated to emit light of wavelength 265 nm for 350 hours. Peels were observed in the adhesive layer, and the window member of synthetic quartz glass separated from the receptacle of alumina-based ceramic. On observation of the peeled adhesive layer, there were found fissures in the adhesive layer, which were attributable to increased crosslinks in the structure by short-wavelength light.

Comparative Example 2

Onto a synthetic quartz glass substrate (window member) cut to 3.5 mm squares as in Example 1, a gold-tin alloy paste (Au-20Sn, Mitsubishi Material Co., Ltd.) was applied by screen printing as in Example 1, obtaining a synthetic quartz glass lid whose window member coated with the adhesive. To a receptacle of alumina-based ceramic material having an LED chip capable of emitting light of wavelength 280 nm mounted therein, the synthetic quartz glass lid was pressed at 280° C. under a load of 1 kg/cm² for 20 minutes, to bond the receptacle and the window member, completing an optical device package.

The optical device package was operated to emit light of wavelength 280 nm for 500 hours. Peels were observed in the adhesive layer, and the synthetic quartz glass separated from the alumina-based ceramic.

Japanese Patent Application No. 2016-152495 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A synthetic quartz glass lid comprising
a window member of synthetic quartz glass, and
an adhesive formed on and directly contacting with a periphery of a main surface of the window member, wherein
said adhesive is a low-melting metallic glass that has a form of an alloy consisting essentially of tellurium, silver and at least one element selected from the group consisting of phosphorus, barium, and zirconium.

2. The synthetic quartz glass lid of claim 1 wherein the low-melting metallic glass contains 50 to 70% by weight of tellurium and silver combined.

3. The synthetic quartz glass lid of claim 1 wherein the low-melting metallic glass has a glass transition temperature of 100 to 450° C.

4. The synthetic quartz glass lid of claim 1 wherein the window member is of plate shape, spherical shape having a convex or concave contour, or non-spherical shape having a convex or concave contour.

5. The synthetic quartz glass lid of claim 1 wherein the window member has a thickness of 0.1 to 5 mm.

6. An optical device package comprising
an optical device,
a box-shaped receptacle having an open upper end, the optical device being received in the receptacle, and
the synthetic quartz glass lid of claim 1, wherein
the window member of synthetic quartz glass is bonded to the upper end of the receptacle with the adhesive to cover the receptacle.

7. The package of claim 6 wherein the optical device emits light of wavelength up to 300 nm.

8. The synthetic quartz glass lid of claim 1 wherein the alloy has disordered crystalline structure.

* * * * *